(12) United States Patent  
Kumazaki et al.

(10) Patent No.: US 9,093,814 B2  
(45) Date of Patent: Jul. 28, 2015

(54) OPTICAL DEVICE, AND LASER CHAMBER AND GAS LASER APPARATUS USING THE SAME

(71) Applicant: Gigaphoton Inc., Oyama-shi, Tochigi (JP)

(72) Inventors: Takahito Kumazaki, Oyama (JP); Kouji Kakizaki, Oyama (JP); Masanori Yashiro, Oyama (JP)

(73) Assignee: GIGAPHOTON, INC., Oyama, Tochigi (JP)

( * ) Notice: Subject to any disclaimer, the term of this patent is extended or adjusted under 35 U.S.C. 154(b) by 0 days.

(21) Appl. No.: 14/220,956

(22) Filed: Mar. 20, 2014

(65) Prior Publication Data

US 2014/0286366 A1    Sep. 25, 2014

(30) Foreign Application Priority Data

Mar. 22, 2013   (JP) ................................ 2013-060103

(51) Int. Cl.
*H01S 3/00* (2006.01)
*H01S 3/038* (2006.01)
*G02B 5/20* (2006.01)
*G03F 7/20* (2006.01)

(52) U.S. Cl.
CPC ............... *H01S 3/038* (2013.01); *G02B 5/208* (2013.01); *G03F 7/20* (2013.01)

(58) Field of Classification Search
CPC . H01S 3/0092; H01S 3/06754; H01S 3/2316; H01S 3/302; H01S 2301/02; H01S 3/005; H01S 3/094007; H01S 3/097; H01S 3/10; H01S 3/10015; H01S 3/10023; H01S 3/10046; H01S 3/10061; H01S 3/109

USPC ................................ 372/38.05, 55, 103, 105
See application file for complete search history.

(56) References Cited

U.S. PATENT DOCUMENTS

| | | | | |
|---|---|---|---|---|
| 5,263,267 | A | * | 11/1993 | Buttner et al. ................... 34/519 |
| 2006/0151422 | A1 | * | 7/2006 | Manley ......................... 215/341 |
| 2007/0051612 | A1 | * | 3/2007 | Herrera Orendain et al. ............................. 202/152 |
| 2008/0013589 | A1 | | 1/2008 | Melchior et al. |
| 2010/0275845 | A1 | * | 11/2010 | Kogure .......................... 118/722 |
| 2011/0089067 | A1 | * | 4/2011 | Scott et al. .................. 206/459.5 |

FOREIGN PATENT DOCUMENTS

JP    4803680 B2    10/2011
JP    4883641 B2    2/2012

OTHER PUBLICATIONS

Daniel C. Harris, Materials for Infrared Windows and Domes: Properties and Performance, ISBN-10: 0819434825, Aug. 1, 1999.*

* cited by examiner

*Primary Examiner* — Colleen A Matthews
*Assistant Examiner* — Vu A Vu
(74) *Attorney, Agent, or Firm* — Hogan Lovells US LLP

(57) ABSTRACT

An optical device includes a plate-like optical element made of a calcium fluoride crystal, a holding member to sandwich and hold the optical element, a seal member provided between the holding member and one surface of the optical element in close contact therewith, and a cushioning member provided between the holding member and the other surface of the optical element in contact therewith. The cushioning member is made of one of a 304 stainless steel, a 303 stainless steel, a 316 stainless steel, a Hastelloy™ alloy, a carbon steel for machine construction S45C, and Inconel™.

14 Claims, 7 Drawing Sheets

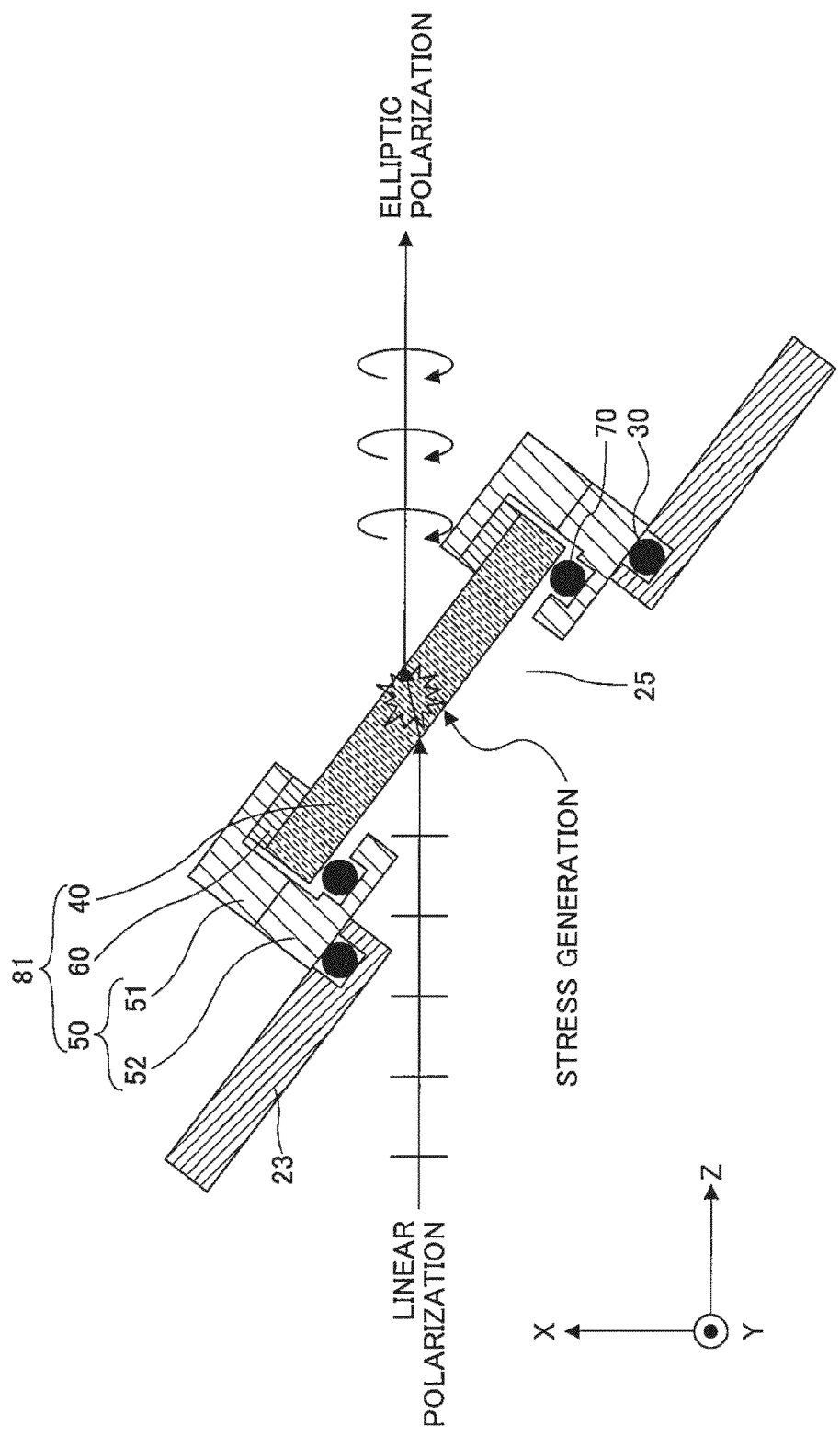

PARALLELISM = |T1−T2|

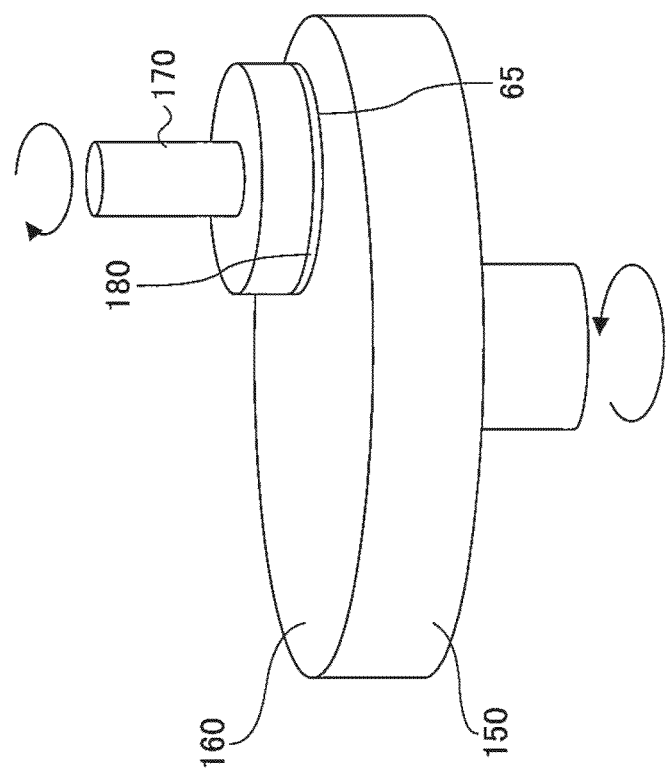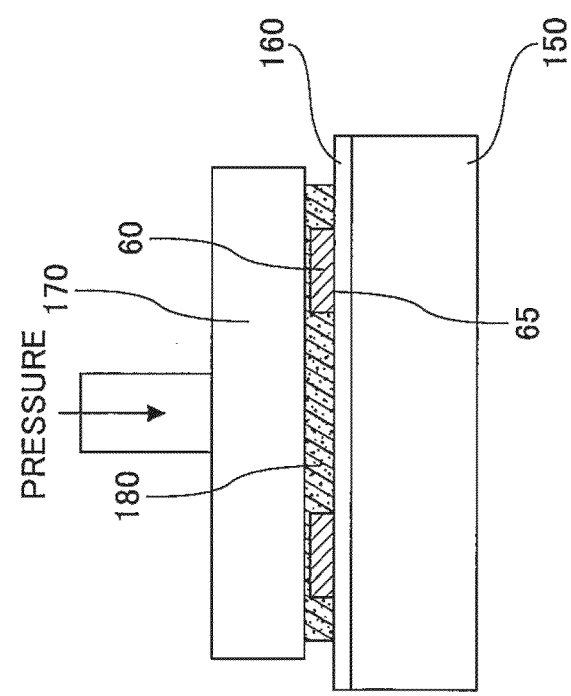

OPTICAL DEVICE, AND LASER CHAMBER AND GAS LASER APPARATUS USING THE SAME

CROSS REFERENCE TO RELATED APPLICATIONS

This patent application is based upon and claims the benefit of priority of Japanese Patent Application No. 2013-060103, filed on Mar. 22, 2013, the entire contents of which are incorporated herein by reference.

BACKGROUND

1. Technical Field

The disclosure relates to an optical device, and a laser chamber and a gas laser apparatus using the same.

2. Related Art

The miniaturization and enhanced levels of integration of semiconductor integrated circuits have led to a demand for increases in the resolution of semiconductor exposure devices (called "exposure devices" hereinafter). Accordingly, advances are being made in the reduction of the wavelengths of light emitted from exposure light sources. Gas laser devices are being used as exposure light sources instead of a conventional mercury lamps. At present, a KrF excimer laser device that emits ultraviolet light at a wavelength of 248 nm and an ArF excimer laser device that emits ultraviolet light at a wavelength of 193 nm are being used as gas laser devices for exposure.

Immersion exposure, in which the apparent wavelength of an exposure light source is reduced by filling the space between the exposure lens of an exposure device and a wafer with a liquid and changing the refractive index, has been practiced as the present exposure technique. In the case where immersion exposure is carried out using an ArF excimer laser device as the exposure light source, the wafer is irradiated with ultraviolet light at a wavelength of 134 nm within the liquid. This technique is referred to as ArF immersion exposure (or ArF immersion lithography).

The natural oscillation amplitude of a KrF or ArF excimer laser device is as wide as 350-400 pm, and thus chromatic aberration will occur at laser light (ultrasonic light) reducedly projected on the wafer if the projection lens in the device is used, leading to a drop in the resolution. It is therefore necessary to narrow the spectral line width of the laser beam emitted from the gas laser device until the chromatic aberration reaches a level that can be ignored. Here, a spectral line width is also called a spectral width. Accordingly, the spectral width has been narrowed by providing a line narrowing module (LNM) having a line narrowing element within the laser resonator of the gas laser device. Here, the line narrowing element may be an etalon, grating or the like. A laser device that narrows the spectral width in this manner is called a narrow-band laser device.

SUMMARY

An optical device according to one aspect of the present disclosure may include a plate-like optical element made of a calcium fluoride crystal, a holding member to sandwich and hold the optical element, a seal member provided between the holding member and one surface of the optical element in close contact therewith, and a cushioning member provided between the holding member and the other surface of the optical element in contact therewith. The cushioning member is made of one of a 304 stainless steel, a 303 stainless steel, a 316 stainless steel, a Hastelloy™ alloy, a carbon steel for machine construction S45C, and Inconel™.

An optical device according to another aspect of the present disclosure may include a plate-like optical element made of a calcium fluoride crystal, a holding member to sandwich and hold the optical element, a seal member provided between the holding member and one surface of the optical element in close contact therewith, and a cushioning member provided between the holding member and the other surface of the optical element in contact therewith and having a hardness equal to or more than that of a calcium fluoride crystal.

BRIEF DESCRIPTION OF THE DRAWINGS

Hereinafter, selected embodiments of the present disclosure will be described merely as examples with reference to the accompanying drawings.

FIG. 2 is a drawing illustrating an example of an optical device according to an embodiment of the present disclosure;

FIGS. 3A and 3B are drawings illustrating an example of a cushioning member used in the optical device according to an embodiment of the present disclosure, in which FIG. 3A is a top view of the cushioning member of the optical device according to the embodiment, and FIG. 3B is an A-A cross-sectional view of the cushioning member illustrated in FIG. 3A;

FIGS. 4A through 4C are drawings for explaining items showing processing accuracy, in which FIG. 4A is a drawing for explaining a height of an edge protrusion, FIG. 4B is a drawing for explaining surface roughness, and FIG. 4C is a drawing for explaining flatness;

FIGS. 6A and 6B are drawings illustrating an example of a lapping process for manufacturing a cushioning member of an optical device according to an embodiment of the present disclosure, in which FIG. 6A is a side view illustrating an example of the lapping process, and FIG. 6B is a perspective view illustrating an example of the lapping process.

DETAILED DESCRIPTION

Figure 1:
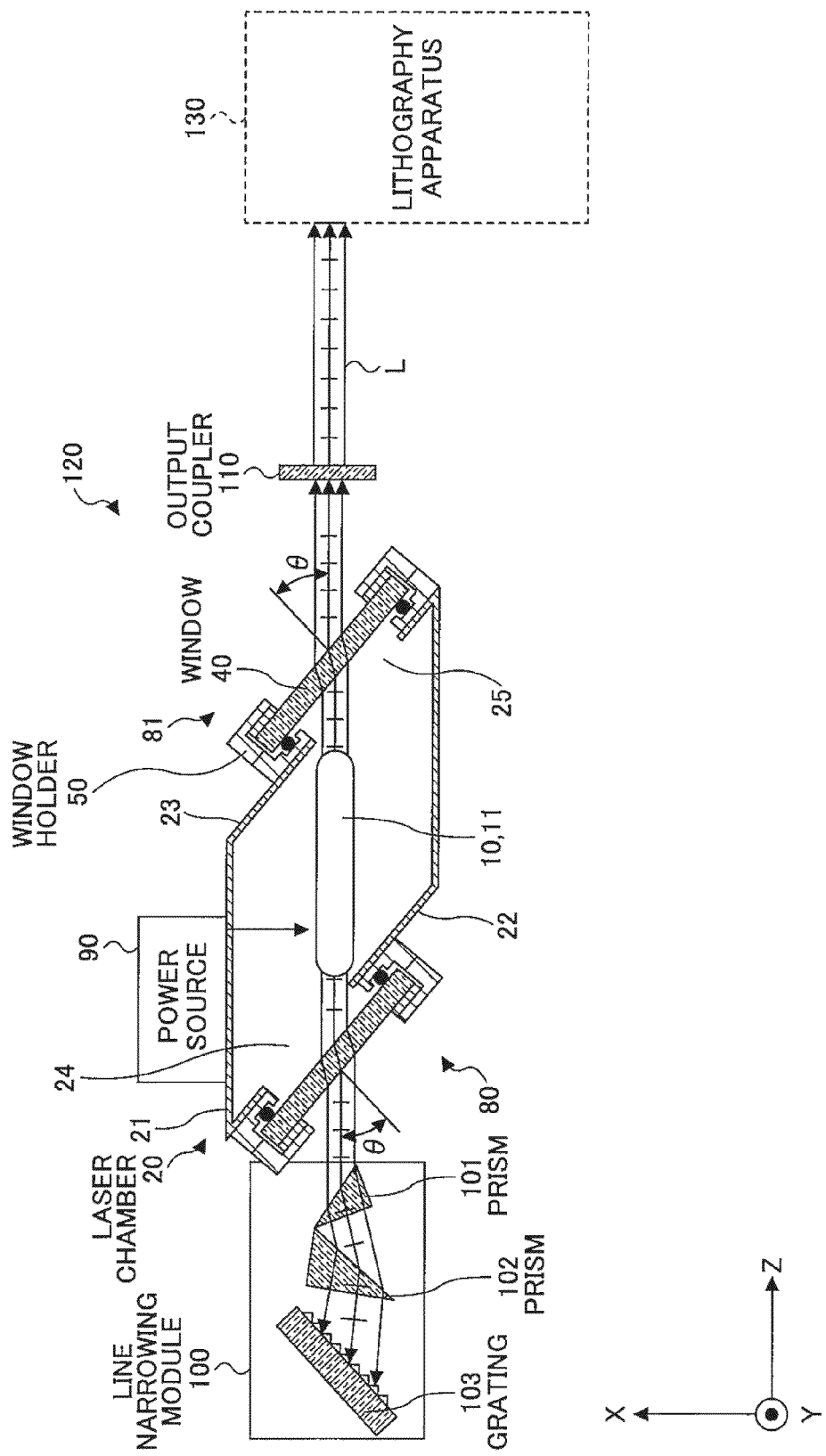
FIG. 1 is a drawing illustrating an example of a laser apparatus for lithography according to an embodiment of the present disclosure.

Hereinafter, selected embodiments of the present disclosure will be described in detail with reference to the accompanying drawings. The embodiments to be described below are merely illustrative in nature and do not limit the scope of the present disclosure. Further, the configuration(s) and operation(s) described in each embodiment are not all essential in implementing the present disclosure. Note that like elements are referenced by like reference numerals and characters, and duplicate descriptions thereof will be omitted herein.

Contents
1. Overview
2. Gas Laser Apparatus
2.1 Configuration
2.2 Operation

3. Optical Device
3.1 Configuration
3.2 Change of Polarization by Stress Birefringence
4. Cushioning member
4.1 Structure
4.2 Hardness Comparison of Materials
4.3 Experimental Result 1. Overview The present disclosure relates to an optical device, and a laser chamber and a gas laser apparatus using the same, where for example, the optical device relates to a window holder including a window.

2. Gas Laser Apparatus
2.1 Configuration

FIG. 1 is a drawing illustrating an example of a gas laser apparatus for lithography according to an embodiment of the present disclosure. The gas laser apparatus for lithography 120 according to the embodiment may include a laser chamber 20, a line narrowing module (LNM: Line Narrowing Module) 100, and an output coupler (OC: Output Coupler) 110. Here, FIG. 1 shows a coordinate system composed of an X axis, a Y axis and a Z axis, and a description is given with respect to a polarization direction of a laser beam by using the coordinates.

The laser chamber 20 may include a housing 21. The housing 21 may be configured in various forms (e.g., tubular in form) depending on an intended purpose as long as the housing 21 has side surfaces 22, 23 facing each other that allow a laser beam L to pass through. Here, although the laser chamber 20 and the housing 21 seem to be almost synonymous with each other in general, the laser chamber 20 means a comprehensive laser chamber module accompanying various components that the laser chamber 20 includes inside or outside thereof such as electrodes 10, 11, while the housing 21 means only a box not including such accompanying components.

The laser chamber 20 may hermetically contain an inactive gas, a buffer gas and a halogen gas as a laser medium. An Ar gas or a Kr gas is cited as an example of the inactive gas, and a Ne gas or a He gas is cited as an example of the buffer gas. Also, a $F_2$ gas or a $Cl_2$ gas may be used as the halogen gas.

The laser chamber 20 may include a pair of electrodes 10, 11 in the housing 21. The electrodes 10, 11 may be configured to be connected to an output terminal of a power source 90 outside the housing 21 to allow a high voltage to be applied. Here, the electrodes 10, 11 may be arranged to face each other at a predetermined interval or gap.

Openings 24, 25 are formed in corresponding facing side surfaces 22, 23 of the housing 21, and a pair of optical devices 80, 81 may be installed so as to cover the respective openings 24, 25 from the outside. The line narrowing module 100 and the output coupler 110 may be arranged to form a resonator that resonates a laser beam generated by a discharge between the electrodes 10, 11 between the line narrowing module 100 and the output coupler 110. The optical devices 80, 81 may be arranged on an optical path of the resonator. The optical devices 80, 81 may include windows 40 and window holders 50. The windows 40 may be arranged to close the openings 24, 25 in the facing side surfaces of the housing 21, and to let the laser beam L penetrate through.

Two of the window holders 50 may be arranged at a predetermined angle relative to the optical path of the laser beam L so as to let the laser beam L amplified between the line narrowing module 100 and the output coupler 110 pass through the windows 40 at a predetermined angle of incidence θ. The angle of incidence θ to the windows 40 may be set so that a plane of incidence includes the X axis in the vicinity of Brewster's angle (55 through 62 degrees).

A material of the windows 40 may be calcium fluoride crystal. The calcium fluoride crystal can be preferably utilized as a material of the windows 40 of the laser chamber 20 because the calcium fluoride crystal has a high transmittance in a wavelength range of ultraviolet rays (e.g., 193 nm or 248 nm) and scarcely absorbs light in the wavelength range. With respect to the optical devices 80, 81, the laser chamber 20 and the gas laser apparatus for photolithography of the present embodiment, a description is given by citing an example of using the calcium fluoride crystal for the windows 40.

Here, a detailed description of a configuration of the optical devices 80, 81 is given later.

The line narrowing module 100 may include a plurality of prisms 101, 102 and a grating 103. The line narrowing module 100 may be arranged outside the optical devices 80, 81, and the prisms 101, 102 and the grating 103 may be arranged on the optical path of the laser beam L.

The prisms 101, 102 may be arranged so as to expand a beam width of the laser beam L. A film to suppress reflection of p-polarized light may be coated on slope faces of the prisms 101, 102. The planes of incidence of the prisms 101, 102 may be arranged to include the X axis.

The grating 103 may be arranged in a Littrow layout in which the angle of incidence and a diffraction angle of the laser beam L expanded by the prisms 101, 102 coincide with grooves of the grating 103. A plane of incidence of the grating 103 may be arranged to include the X axis.

The output coupler 110 may be arranged outside the optical device 81. Moreover, the output coupler 110 may be arranged to form a laser resonator with the line narrowing module 100. A surface of the output coupler 110 may be coated with a film to partially reflect the laser beam L.

The laser chamber 20 may be arranged on the optical path of the laser resonator constituted of the line narrowing module 100 and the output coupler 110. The two windows 40 provided on the laser chamber 20 may be arranged in positions through which the laser beam L on the optical path passes within the laser resonator.

A beam delivery system including a high reflective mirror not shown in the drawing may be arranged on the optical path of the laser beam L between the output coupler 110 and a photolithography apparatus 130 so that the output laser beam L enters the photolithography apparatus 130. The photolithography apparatus 130 may perform a photolithography process using the laser beam L output from the gas laser apparatus 120 of the present embodiment.

2.2 Operation

Next, a description is given below on the gas laser apparatus 120 of the present embodiment.

To begin with, when a pulsing voltage is applied between the electrodes 10, 11 by the power source 90, a discharge can occur between the electrodes 10, 11. A laser medium that has obtained energy by the discharge that can supply the energy to the laser medium goes into an excited state, and can emit ultraviolet light that is spontaneous emission light when the excited state returns to the ground state. The ultraviolet light by the spontaneous emission can be randomly polarized light. This ultraviolet light of the random polarization is amplified by stimulated emission, and for example, goes through the window 40 of the optical device 80, and a p-polarized (X-direction) component can penetrate through the plane of incidence of the window 40 with high transmittance. The light having gone through the window 40 of the optical device 80 penetrates through the prisms 101, 102, by which a p-polarized (X-direction) component can go through the plane of incidence of the slope faces of the prisms 101, 102 with further high transmittance, and a s-polarized component (Y-direction) can be efficiently reflected from the plane of incidence of the slope faces of the prisms 101, 102. As a result, the beam of the ultraviolet light can be expanded, and a rate of the polarized component in the X direction can be increased.

The expanded ultraviolet light enters the grating 103 at a predetermined angle, and light diffracted at the same angle as the angle of incidence goes through the prisms 101, 102 again, by which the beam is compressed and the rate of the polarized component in the X direction can be further increased. This ultraviolet light penetrates through the window 40 of the optical device 80 again, by which the p-polarized (X-direction) component can go through the plane of incidence of the window 40 with high transmittance and can be emitted by stimulated emission by passing through the discharge space, and can be amplified in a state of maintaining this polarization state (ultraviolet light including many X-direction components). The p-polarized component of the amplified light can be made highly transmissive by penetrating through the window 40 of the optical device 81.

A part of the amplified light can be output by the output coupler 110, and a part of the amplified light can be laser-oscillated by traveling back and forth within the laser resonator. At this time, the output laser beam L can be narrowed by the line narrowing module 100. Then the output laser beam L can increase the rate of the polarized component in the X direction by reflective properties of the two windows 40 and the slope faces of the prisms 101, 102. The laser beam L whose polarized component in the X direction has increased can enter the photolithography apparatus 130.

In this manner, the gas laser apparatus 120 of the present embodiment can output, for example, the laser beam L including a polarized component in the X direction at a high rate using two windows 40 and the prisms 101, 102.

3. Optical Device
3.1 Configuration

FIG. 2 is a diagram illustrating an example of an optical device 81 of the present embodiment. Here, in FIG. 2, a description is given with respect to the optical device 81 arranged to seal the opening 25 of the housing 21, but an optical device 80 arranged to seal the opening 24 of the housing 21 may have a similar configuration. Moreover, in the following description, the optical device 80 may have a configuration similar to the optical device 81.

The optical device 81 of the present embodiment includes the window 40, the window holder 50, a cushioning member 60, and a seal member 70. Furthermore, the side surface 23 of the housing 21 of the laser chamber 20 and a seal member 30 are illustrated in FIG. 2 as related components.

The window 40 may be configured in various forms depending on an intended purpose as long as the window 40 has a plate-like shape. For example, the window 40 may be formed into a disk-like shape. In addition, the window 40 may be made of calcium fluoride crystal.

The window holder 50 may be a holding member that holds the window 40 by sandwiching an outer periphery of the window 40 from both sides. Accordingly, the window holder 50 may include a holder 51 and a holder 52 to hold the plate-like window 40 by sandwiching the plate-like window 40 from both sides. FIG. 2 illustrates the holder 51 on the side distant from the laser chamber 20 and the holder 52 on the side close to the laser chamber 20, by both of which the window 40 is held in a thickness direction. The window holder 50 may hold the window 40 by sandwiching both sides of the outer periphery of the window 40 from the outer edge side of the window 40.

The window holder 50 may have a conforming shape along an outer circumferential shape of the window 40. For example, when the window 40 is formed into a disk-like shape, the window holder 50 may have an annular shape (ring shape).

The cushioning member 60 is a member to cushion a holding force applied by the holder 51 to the window 40, by being provided between the holder 51 opposite to the laser chamber 20 and the window 40 in contact with the holder 51 and the window 40. By providing the cushioning member 60 between the holder 51 and the window 40, a pushing force applied to the window 40 from the holder 51 can be reduced.

The cushioning member 60 may be formed of a material, for example, selected from any of 304 stainless steel (SUS 304), 303 stainless steel (SUS 303), 316 stainless steel (SUS 316), Hastelloy™ alloy (corrosion-resistant nickel alloy), Inconel™ (heat-resistant nickel alloy), and S45C (carbon steel for machine construction). These materials have proper hardness to be processed by polishing, and can be processed with sufficient processing accuracy by polishing. Hence, the cushioning member 60 may have a polished surface formed by polishing, and preferably have a minor-polished surface formed by mirror polishing. The above-mentioned materials are appropriate to form the mirror-polished surface. Here, a detailed description is given later on a material of the cushioning member 60.

The cushioning member 60 may have a conforming shape along the outer circumferential shape of the window 40 because the cushioning member 60 is used by being inserted between the holder 51 that holds the outer periphery of the window 40 and the window 40. Accordingly, for example, when the window 40 has a disk-like shape, the cushioning member 60 may have an annular shape (ring shape).

The seal member 70 may be an O-ring, and for example, may be made of an elastic material such as rubber, metal and the like. The seal member 70 may be arranged so as to seal the laser gas in the laser chamber 20 between one side of the window 40 and the holder 52. More specifically, the seal member 70 may seal the window 40 by being provided between the holder 52 on the side close to the laser chamber 20 and the window 40.

The holder 51 and the holder 52 may be joined together by a bolt not shown in the drawing so as to sandwich the cushioning member 60, the window 40 and the seal member 70. By tightening the bolt in this state, the window holder 50 can hold the window 40 by sandwiching the window 40 through the cushioning member 60 and the seal member 70.

Moreover, the window holder 50 and the laser chamber 20 may be fixed by sealing a space between the window holder 50 and the laser chamber 20 with the seal member 30. The seal member 30 may be an O-ring made of an elastic material similarly to the seal member 70. This allows the optical device 81 including the window holder 50 and the window 40 to be arranged on the side surface 23 of the housing 21 so that the window holder 50 is in close contact with the laser chamber 20. Furthermore, by installing the optical device 81, the opening 25 of the housing 21 may be closed and sealed, and the laser beam L can go through the inside of the laser chamber 20 from the window 40.

3.2 Change of Polarization by Stress Birefringence

Next, a description is given below on a problem in the optical device including the window.

As shown in the optical device 81 illustrated in FIG. 2, mechanical stress caused by a pushing force applied by the holder 50 on the window 40 and heat generated by absorbing the laser beam L may cause stress in a portion of the window 40 through which the laser beam L penetrates. More specifically, the stress is thought to be generated by the following action.

When linearly-polarized light in the X direction is assumed to enter the window 40 at a predetermined angle of incidence from the laser chamber 20 side, birefringence can be caused in the window 40 by mechanical stress and thermal stress generated inside the window 40. When the birefringence is caused, the linearly-polarized light can be converted to elliptically-polarized light because the phase is shifted by going through the window 40. As a result, a problem of decreasing polarization purity can be caused. Here, the polarization purity can be obtained by the following formula (1).

$$\text{Polarization Purity} = \text{Polarization Component in } X \text{ Direction}/(\text{Polarization Component in } X \text{ Direction} + \text{Polarization Component in } Y \text{ Direction}) \qquad (1)$$

In addition, since the polarization purity becomes worse when the stress birefringence is caused in the window 40, the polarization purity of the laser beam L output from the output coupler 110 can be worse. Moreover, when the stress birefringence is caused in the window 40 for the ultraviolet light, the polarization purity of the ultraviolet light having gone through the window 40 becomes worse. Accordingly, a reflection loss can increase at the surface of the window 40 and the surfaces of the prisms 101, 102, and power of the output laser beam L can decrease. More specifically, the polarization component in the X direction can penetrate through the window 40 and the prisms 101, 102 with high transmittance, and the polarization component in the Y direction can be highly reflected. As a result, the loss can further increase as the polarization component in the Y direction increases and the polarization component in the X direction decreases.

Then, when the laser is oscillated in a case that the mechanical stress caused by the window holder 50 is applied to the calcium fluoride crystal from the beginning, the polarization purity can further deteriorate as the power of the output laser beam increases.

Here, the inventors have found that when aluminum or tin-plated aluminum is used in the cushioning member 60, even though the cushioning member 60 can function as a cushion when the window holder 50 holds the window 40, sufficient processing accuracy may not be obtained because the material is too soft. In an ArF laser apparatus having an output of 40 W, the deterioration of the polarization purity of the output laser beam has hardly caused a problem even though sufficient processing accuracy has not been obtained. However, in an ArF laser apparatus having an output of 60 W or more, if the processing accuracy of the cushioning member 60 is low, the mechanical stress is caused by irregularity in the surface of the cushioning member 60 and the mechanical stress can be generated in the window 40 when the window holder 50 holds the window 40.

Therefore, in the optical device 81 of the present embodiment, a material in which a polished surface can be formed with high accuracy by the present polishing process is used for the cushioning member 60, and the optical device 81 may be configured by using the cushioning member 60 having a polished surface. As mentioned above, 304 stainless steel (SUS 304), 303 stainless steel (SUS 303), 316 stainless steel (SUS 316), Hastelloy™ alloy (corrosion-resistant nickel alloy), Inconel™ (heat-resistant nickel alloy), and S45C (carbon steel for machine construction) are materials capable of being processed by polishing to satisfy the process accuracy required for the cushioning member 60 used for the ArF laser apparatus 120 having a high output of 60 W or more. These materials can be processed to form a mirror-polished surface by mirror polishing. Moreover, as long as the required processing accuracy is satisfied, a variety of materials can be used as the cushioning member 60 other than the above-mentioned materials. For example, if the material is harder than the calcium fluoride crystal, or the material has hardness equal to or more than that of the calcium fluoride crystal, it is thought to be possible to perform a polishing process that meets the requirement of the processing accuracy, especially the mirror polishing process.

The optical device 81 of the present embodiment is configured to prevent the stress birefringence from being caused in a part of the window 40 transmissive for the laser beam L, by processing a surface of the cushioning member 60 contacting the window 40 into a polished surface, preferably into a mirror-polished surface so as to enhance the processing accuracy of the surface contacting the window 40. Here, a configuration similar to the optical device 81 may be adopted in the optical device 80, and a surface contacting the window 40 may be configured as a polished surface, preferably a mirror-polished surface.

4. Cushioning Member
4.1 Structure

Next, a detailed description is given below on a configuration of a cushioning member 60 in optical devices 80, 81 according to an embodiment.

Figure 3A:
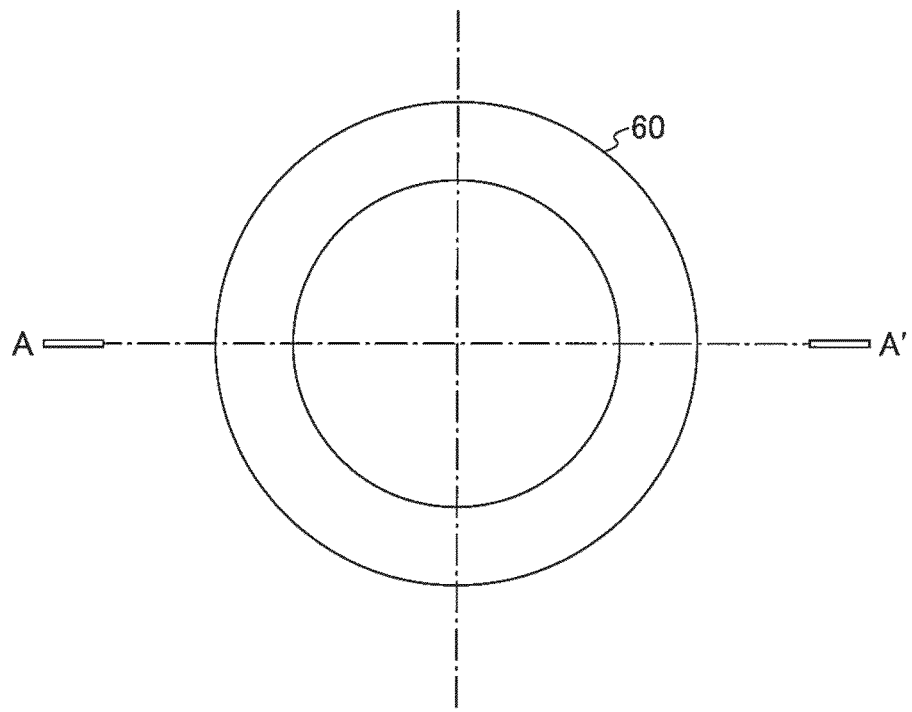
Figure 3B:
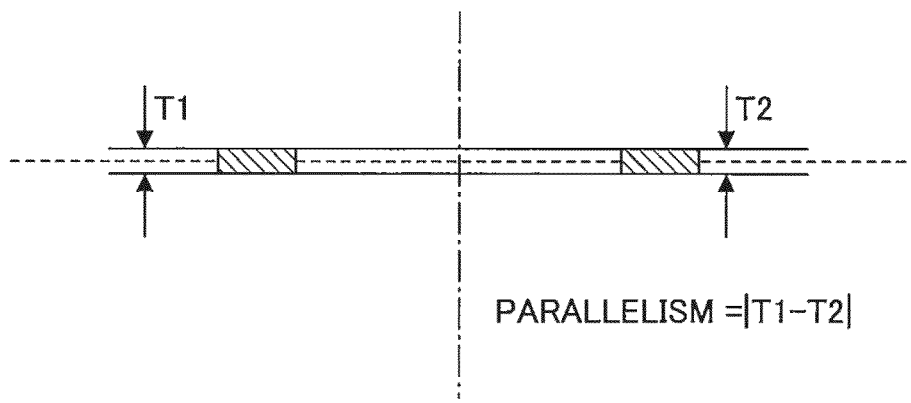

FIGS. 3A and 3B are drawings illustrating an example of the cushioning member 60 used in an optical device according to an embodiment. FIG. 3A is a top view of the cushioning member 60 of the optical device of the present embodiment, and FIG. 3B is an A-A cross-sectional view of the cushioning member 60 illustrated in FIG. 3A.

As illustrated in FIG. 3A, the cushioning member 60 may have a ring-like shape. Moreover, as illustrated in FIG. 3B, the cushioning member 60 may have flat surfaces as the top surface and the bottom surface, and the top surface and the bottom surface may be configured to be mutually parallel.

A surface of the cushioning member 60 of the present embodiment on the side to contact the window 40 preferably satisfies conditions of the processing accuracy shown in the following formulas (2) through (5).

$$\text{Parallelism} \leq 0.01 \text{ mm} \qquad (2)$$

$$\text{Height of Edge Protrusion} < 0.2 \text{ μm} \qquad (3)$$

$$\text{Surface Roughness} < 0.2 \text{ μm} \qquad (4)$$

$$\text{Flatness} \leq 0.01 \text{ mm} \qquad (5)$$

A description is given below on respective conditions.

As illustrated in FIG. 3B, when the thickness of the cushioning member 60 on the left side is expressed as T1, and the thickness on the right side is expressed as T2, the flatness is expressed by formula (6).

$$\text{Flatness} = |T1 - T2| \qquad (6)$$

In formula (2), meeting |T1−T2|<0.01 mm is required, and high uniformity of the thickness of the cushioning member 60 is required.

Figure 4A:
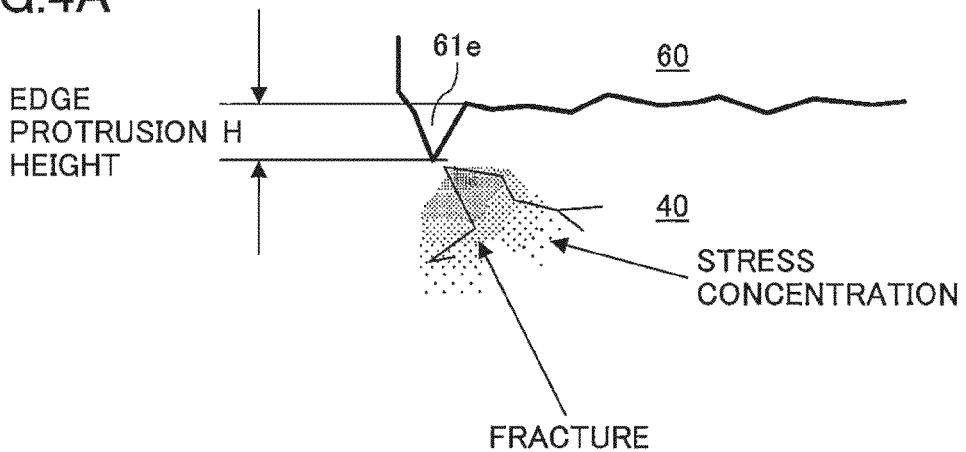
Figure 4B:
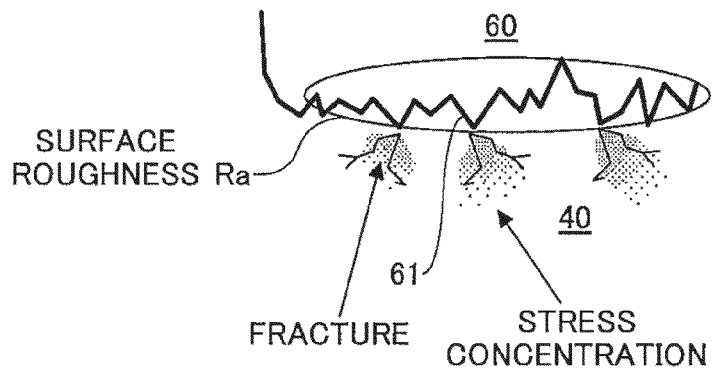
Figure 4C:
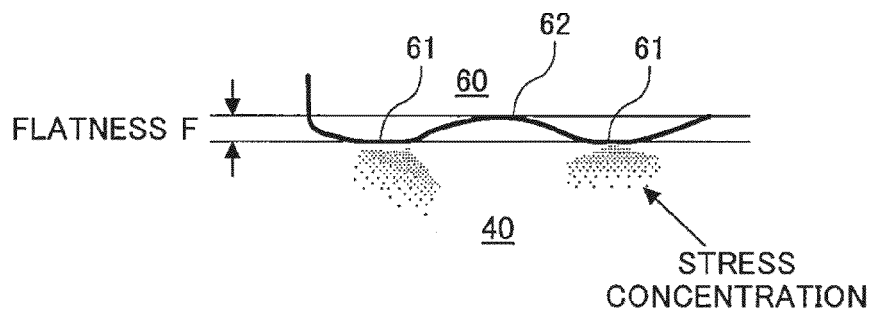

FIGS. 4A through 4C are drawings for explaining items showing the processing accuracy. FIG. 4A is a drawing for explaining a height of an edge protrusion. In FIG. 4A, a height H of an edge protrusion 61e of the cushioning member 60 is illustrated. It is noted that a stress concentrates on a portion that the edge protrusion 61e contacts and the window 40 is likely to be damaged when the height H of the edge protrusion 61e is high.

Accordingly, as shown in formula (3), the optical devices 80, 81 of the present embodiment preferably satisfy the condition in which the height H of the edge protrusion 61e of the cushioning member 60 that contacts the window 40 is less than 0.2 μm. By setting the height H of the edge protrusion 61e at a value less than 0.2 μm, the stress and fracture that occur in the window 40 can be reduced.

FIG. 4B is a drawing for explaining roughness of a surface. In FIG. 4B, a surface of the cushioning member 60 is illustrated. The surface is processed roughly, and protrusions 61 are formed of irregularities. When the protrusions 61 contact the window 40, the window 40 can be damaged owing to that the stress concentrates on portions that contact the protrusions 61 and expands to a portion through which the laser beam L penetrates.

Accordingly, as shown in formula (4), in the optical devices 80, 81 of the present embodiment, the surface roughness of a surface of the cushioning member 60 that contacts the window 40 is preferably less than 0.2 μm. By making the surface roughness Ra smaller than 0.2 μm, the stress and damage caused in the window 40 can be reduced. Here, the surface roughness Ra may be, for example, expressed by using an arithmetic mean roughness Ra.

FIG. 4C is a drawing for explaining flatness. As illustrated in FIG. 4C, protrusions 61 and a depression 62 are formed. The flatness F is a magnitude of a deviation from the geometrically correct plane, and is expressed by a distance between two parallel planes that minimizes the distance therebetween when the depression 62 and the protrusions 61 are sandwiched by the geometrically correct two parallel planes. In FIG. 4C, when the distance of the two parallel planes that sandwich the protrusions 61 and the depression 62 is minimized, the distance indicates the flatness F, and the stress concentrates on the portions of the window 40 that contacts the protrusions 61.

Hence, in the optical members 80, 81, as shown in formula (5), the flatness F of the surface of the cushioning member 60 that contacts the window 40 is preferably 0.01 mm or less. By setting the flatness F of the surface of the cushioning member 60 at 0.01 mm or less, the stress and damage generated in the window 40 that contacts the surface of the cushioning member 60 can be reduced.

Figure 5:
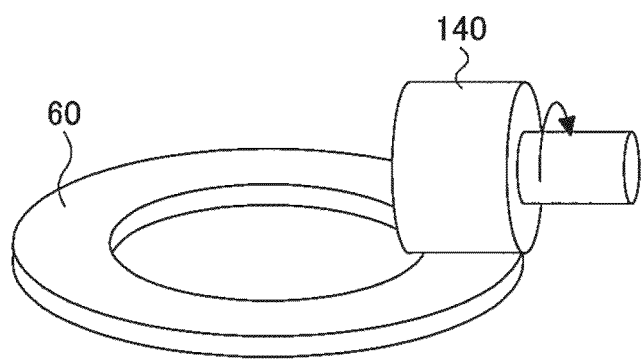
FIG. 5 is a drawing illustrating an example of a buffing process for manufacturing a cushioning member of an optical device according to an embodiment of the present disclosure.

FIG. 5 is a drawing illustrating an example of a buffing process for manufacturing a cushioning member 60 of an optical device of an embodiment. In the buffing process, a surface of the cushioning member 60 is buffed by infiltrating slurry into an outer peripheral surface of a buffing wheel 140 made of cloth or other materials or applying the slurry on the surface of the cushioning member 60, and by rotating the buffing wheel 140 while pressing the cushioning member 60 against the buffing wheel 140. The rotation of the buffing wheel 140 is, for example, performed at a high speed being a linear speed of about 120 km per hour. Furthermore, cloth called a buff may be used for the buffing wheel 140.

The cushioning member 60 may be made of, for example, as described in FIGS. 2 through 3B, metal material such as the above-mentioned stainless steel and the like. A material that can form a polished surface at a proper processing accuracy by the buffing process can be selected as the cushioning member 60, and the shape may be a ring-like shape.

By performing the buffing, the surface of the cushioning member 60 can be buffed.

FIGS. 6A and 6B are drawings illustrating an example of a lapping process for manufacturing a cushioning member 60 of an optical device of an embodiment. FIG. 6A is a side view illustrating an example of a lapping process, and FIG. 6B is a perspective view illustrating an example of a lapping process.

As shown in FIGS. 6A and 6B, in the lapping process, a work 65 is placed on an abrasive 160 in a state of placing the abrasive on a lapping machine 150. In addition, the surface of the cushioning member 60 is polished by applying pressure with a pressure plate 170 from the upper side of the cushioning member 60, and by rotating both the lapping machine 150 and the pressure plate 170 while supplying slurry between the abrasive 160 and the cushioning member 60. Moreover, resin 180 may be provided around the cushioning member 60 to prevent the edge portion of the work 65 from being polished more than the central portion thereof.

Here, as described in FIG. 5, a material that can achieve an appropriate processing accuracy by the lapping may be selected for the cushioning member 60, and the shape may be, for example, a ring shape.

By performing the lapping process, the surface of the work 65 is minor polished, by which a mirror-polished surface is formed and the cushioning member 60 of the optical device 80, 81 of the present embodiment is formed. Accordingly, the lapping process may be called a minor polishing process.

Here, in the polishing process, the lapping process illustrated in FIGS. 6A and 6B may be performed after performing the buffing process illustrated in FIG. 5, or only the lapping process may be performed. Furthermore, when the buffing process can achieve sufficient polishing, only the buffing process may be performed. By performing such a polishing process, the cushioning member 60 having a polished surface meeting the conditions of formulas (2) through (5) can be formed by polishing the surface of the cushioning member 60. For example, the cushioning member 60 can be polished so that the surface roughness Ra becomes 0.2 μm or less. An example of lapping only one surface is illustrated as an embodiment of the lapping, but both sides of the work 65 may be polished by using a lapping device that can polish both sides of the work 65 without being limited to the embodiment. By lapping both sides of the work 65, the parallelism of the cushioning member 60 can be improved.

4.2 Hardness Comparison of Materials

Next, a description is given below on metal materials that can be used as the cushioning member 60. TABLE 1 shows various metal materials in descending order of hardness (Vickers hardness: HV conversion).

TABLE 1

| Kinds Of Materials | Hardness (Vickers Hardness: HV Conversion) |
|---|---|
| SKH56 (High-Speed Tool Steel Material, High-Speed Steel) | 722 |
| SUS440C (Stainless Steel) | 615 |
| SKT6 (Alloy Tool Steel Material) | 512 |
| Nickel (Electroless Plating) | 300-500 |
| SCM822 (Chrome Molybdenum Steel, Chromoly Steel) | 302-415 |
| Berylium Copper: After Aging Treatment, C1720 (T) | 350-400 |
| SUS630 (Stainless Steel) | 375 |
| Titanium Alloy Grade 5 (ASTM B348 Gr5) | Around 280 |
| Inconel Alloy ™ (Heat-Resistant Nickel Alloy) | 150-280 |
| S45C (Carbon Steel For Machine Construction) | 201-269 |
| Hastelloy ™ Alloy (Corrosion-Resistant Nickel Alloy) | 100-230 |

TABLE 1-continued

| Kinds Of Materials | Hardness (Vickers Hardness: HV Conversion) |
|---|---|
| SUS304 (Stainless Steel) | 180-230 |
| SUS303 (Stainless Steel) | 180-230 |
| SUS316 (Stainless Steel) | 180-230 |
| Calcium Fluoride Crystal | 189-200 |
| Aluminum Alloy (7000 Series, Extra Super Duralumin) | Around 155 |
| Titanium Alloy | 110-150 |
| Brass | 80-150 |
| Pure Iron | 110 |
| Bronze | 50-100 |
| Aluminum Alloy | 45-100 |
| Carbonyl Iron | 56-80 |
| Magnesium Alloy | 49-75 |
| Armco Iron | 60-65 |
| Platinum (Pure Platinum) | Around 50 |
| Pure Magnesium | 46 |
| Silver | 25 |
| Aluminum | Around 22.7 |
| Gold | 22 (~50 By Heat Treatment) |
| Lead-Free Solder Material | Around 20 |
| Tin | Around 7 |
| Lead | Around 3.9 |
| Indium | Around 1.2 |

As shown in TABLE 1, the hardness of metal materials varies from material to material, and has some range. However, when the materials are arranged based on the average hardness, the materials are listed in the order of TABLE 1.

Material used for the windows 40 of the optical devices 80, 81 of the present embodiment is calcium fluoride crystal. On the other hand, SUS 304, SUS 303, SUS 316, Hastelloy™ alloy, S45C and Inconel™ are materials harder than the calcium fluoride crystal on average. When the polishing process illustrated in FIGS. 5 through 6B are carried out, materials harder than the calcium fluoride crystal are likely to have a higher processing accuracy. Moreover, as long as the materials have hardness equal to or greater than that of the calcium fluoride crystal including the material having hardness similar to that of the calcium fluoride crystal, the polishing to achieve the processing accuracy shown in the formulas (2) through (5) can be implemented.

Accordingly, in the optical devices 80, 81 of the present embodiment, the cushioning members 60 are configured by using the metal material having the hardness equal to or greater than that of the calcium fluoride crystal. Sometimes it takes a lot of time to process the material when the hardness is too high. However, if there is no problem in this regard, for example, titanium alloy grade 5, SUS 630 and the like may be used as the cushioning members 60 of the optical devices 80, 81 of the present embodiment.

In this manner, as long as the cushioning members 60 of the optical devices 80, 81 of the present embodiment are harder than the calcium fluoride crystal, or have the hardness equal to or greater than that of the calcium fluoride crystal, various materials can be applied.

Here, TABLE 1 shows that aluminum used as the cushioning member of the conventional optical device and tin used as a plating material for aluminum have hardness much lower than that of the calcium fluoride crystal, and are soft materials.

4.3 Experimental Result (Working Example)

Next, a description is given below on a working example of a gas laser apparatus using an optical device of the present embodiment. TABLE 2 shows measured results of a gas laser apparatus using an optical device of the present embodiment and a gas laser apparatus using a comparative example in various items.

TABLE 2

| Items | Working Example | Comparative Example |
|---|---|---|
| Cushioning Member Surface Roughness Ra (μm) | <0.2 | 1.6 |
| Cushioning Member Edge Projection Height (μm) | <0.2 | <0.2 |
| Flatness (mm) | ≤0.005 | ≤0.005 |
| Parallelism (mm) | ≤0.005 | ≤0.005 |
| Damage of Window Surface | ○ | ○ |
| Damage Growth to Inside of Window | ○ | ○ |
| Birefringence by Mechanical Stress of Holder (nm) | <0.5 | 1.3 |

In the optical device of the working example, stainless steel (SUS 303 or SUS 304) was used as a cushioning member. In contrast, a cushioning member structured to have a Ni plating layer on a surface of an aluminum substrate and a Sn plating layer on the Ni plating layer was used in the optical device of the comparative example.

In TABLE 2, the cushioning member of the comparative example achieved processing accuracy equivalent to that of the cushioning member of the working example in items of an edge protrusion height, flatness and parallelism, and met the conditions of formulas (2), (3) and (5) as well as the cushioning member of the working example. However, with respect to an item of surface roughness Ra, the cushioning member of the comparative example was Ra=1.6 μm, and only the cushioning member of the working example satisfied the condition of Ra<0.2 μm in formula (4).

Thus, when the stainless steel (SUS 303 or SUS 304) having hardness equal to or greater than that of the calcium fluoride crystal was used as the cushioning members, by performing mirror polishing, the cushioning members to satisfy the processing accuracy of the surface roughness Ra<0.2 μm were manufactured at a high yield rate. Here, the mirror polishing can be performed by using the buffing or lapping described in FIGS. 5 through 6B, or combining the buffing and lapping.

On the other hand, in a case of the cushioning member of the comparative example having a plated layer made of Sn softer than the calcium fluoride crystal, the surface roughness Ra became 1.6 μm. It was difficult to make the surface roughness 0.2 μm or less of the soft material such as Sn, and the yield rate became worse. It is difficult to process the soft metal such as Sn by polishing and to form a polished surface.

In addition, in TABLE 2, there was no problem in both of the optical device of the working example and that of the comparative example, on items of damage of window surface and damage growth to inside of the window. However, the birefringence caused by the mechanical stress of the holder of the optical device of the working example was less than 0.5 nm, while the birefringence of the optical device of the comparative example was 1.3 nm, which was larger than the birefringence of the working example. In this manner, TABLE 2 has shown that the optical device of the working example can remarkably reduce the generation of the birefringence.

Figure 7:
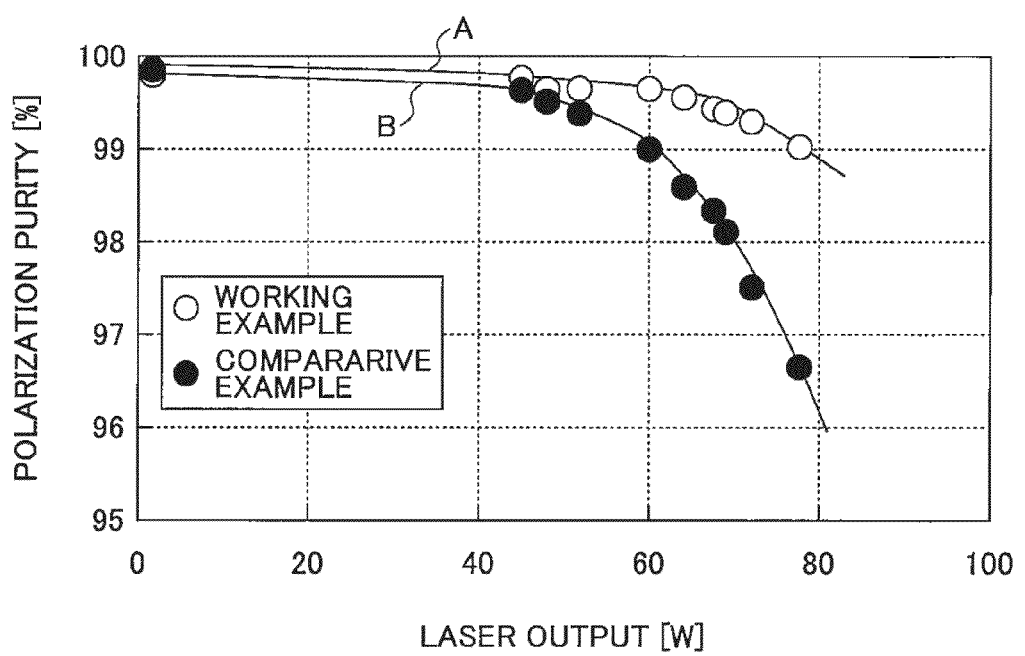
FIG. 7 is a graph showing laser output dependency of polarization purity on a laser beam output from a gas laser apparatus using an optical device of an embodiment and a comparative example.

FIG. 7 is a graph showing laser output dependency of polarization purity on a laser beam output from an ArF gas laser apparatus using the working example and the comparative example. In FIG. 7, a property of a gas laser apparatus using the optical device of the working example is shown by curve A, and a property of a gas laser apparatus of the comparative example is shown by curve B.

In both of the ArF gas laser apparatuses of the working example and the comparative example, the polarization purity became worse as the output of the laser beam increased. However, when the laser output increases, a degree of decrease in polarization purity of the working example was smaller than that of the comparative example. In this manner, FIG. 7 shows that the degree of deterioration of the polarization purity in the gas laser apparatus of the working example has improved compared to that of the gas laser apparatus of the comparative example.

Moreover, a difference of the degree of decrease between the working example and the comparative example was very noticeable when the laser output was 60 W or more, for example, when the laser output was 70 W or 80 W. Accordingly, it is noted that when a high laser output of 60 W or more is required, the gas laser apparatus using the optical device of the working example is highly effective.

The above described embodiments and the modifications thereof are merely examples for implementing the present disclosure, and the present disclosure is not limited thereto. Making various modifications according to the specifications or the like is within the scope of the present disclosure, and other various embodiments are possible within the scope of the present disclosure. For example, the modifications illustrated for particular ones of the embodiments can be applied to other embodiments as well (including the other embodiments described herein).

For example, in the embodiments and the working examples, a description is given with respect to an example of applying the optical device to components around the window of the gas laser apparatus, but the optical device can be applied to various parts or apparatuses as long as the parts or the apparatuses have a configuration that holds an opticalelemenmt.

The terms used in this specification and the appended claims should be interpreted as "non-limiting." For example, the terms "include" and "be included" should be interpreted as "including the stated elements but not limited to the stated elements." The term "have" should be interpreted as "having the stated elements but not limited to the stated elements." Further, the modifier "one (a/an)" should be interpreted as "at least one" or "one or more".

What is claimed is:

1. An optical device comprising:
    a plate-like optical element made of a calcium fluoride crystal;
    a holding member to sandwich and hold the optical element;
    a seal member provided between the holding member and one surface of the optical element in close contact therewith; and
    a cushioning member provided between the holding member and the other surface of the optical element in contact therewith, the cushioning member being made of one of a 304 stainless steel, a 303 stainless steel, a 316 stainless steel, a corrosion-resistant nickel alloy, a carbon steel for machine construction S45C, and a heat-resistant nickel alloy,
    wherein a surface of the cushioning member in contact with the other surface of the optical element meets following conditions, parallelism ≤0.01 millimeters;

height of an edge protrusion <0.2 micrometers;

surface roughness <0.2 micrometers; and flatness ≤0.01 millimeters.

2. The optical device of claim 1, wherein a surface of the cushioning member in contact with the other surface of the optical element has a polished surface formed by polishing.

3. The optical device of claim 2, wherein the polished surface is a mirror-polished surface polished by at least one of buffing and lapping.

4. The optical device of claim 1, wherein the optical element is a window to let a laser beam go through, and the holding member is a window holder.

5. A laser chamber comprising:
    a pair of electrodes;
    a housing containing the pair of electrodes; and
    the optical device of claim 4 attached to facing side surfaces of the housing.

6. A gas laser apparatus comprising:
    the laser chamber of claim 5; and
    an optical resonator provided on both outsides of the optical device.

7. An optical device comprising:
    a plate-like optical element made of a calcium fluoride crystal;
    a holding member to sandwich and hold the optical element;
    a seal member provided between the holding member and one surface of the optical element in close contact therewith; and
    a cushioning member provided between the holding member and the other surface of the optical element in contact therewith and having hardness equal to or greater than that of a calcium fluoride crystal,
    wherein a surface of the cushioning member in contact with the other surface of the optical element meets following conditions, parallelism ≤0.01 millimeters;

height of an edge protrusion <0.2 micrometers;

surface roughness <0.2 micrometers; and flatness ≤0.01 millimeters.

8. The optical device of claim 7, wherein the cushioning member is made of a metal material.

9. The optical device of claim 8, wherein the metal material is made of one of a 304 stainless steel, a 303 stainless steel, a 316 stainless steel, a corrosion-resistant nickel alloy, a carbon steel for machine construction S45C, and a heat-resistant nickel alloy.

10. The optical device of claim 7, wherein a surface of the cushioning member in contact with the other surface of the optical element has a polished surface formed by polishing.

11. The optical device of claim 10, wherein the polished surface is a mirror-polished surface polished by at least one of buffing and lapping.

12. The optical device of claim 7, wherein the optical element is a window to let a laser beam go through, and the holding member is a window holder.

13. A laser chamber comprising:
    a pair of electrodes;
    a housing to house the pair of electrode; and
    the optical device of claim 12 attached to facing side surfaces of the housing.

14. A gas laser apparatus comprising:
    the laser chamber of claim 13; and
    an optical resonator provided on both outsides of the optical device.

* * * * *